（12）United States Patent
Oh et al.

(10) Patent No.: US 11,508,713 B2
(45) Date of Patent: Nov. 22, 2022

(54) METHODS OF MANUFACTURING SEMICONDUCTOR PACKAGE AND PACKAGE-ON-PACKAGE

(71) Applicant: Samsung Electronics Co., Ltd., Suwon-si (KR)

(72) Inventors: Junyoung Oh, Seoul (KR); Kyonghwan Koh, Asan-si (KR); Sangsoo Kim, Cheonan-si (KR); Seunghwan Kim, Asan-si (KR); Jongho Park, Cheonan-si (KR); Yongkwan Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 120 days.

(21) Appl. No.: 17/168,706

(22) Filed: Feb. 5, 2021

(65) Prior Publication Data

US 2021/0242190 A1 Aug. 5, 2021

(30) Foreign Application Priority Data

Feb. 5, 2020 (KR) .................. 10-2020-0013728

(51) Int. Cl.
*H01L 21/56* (2006.01)
*H01L 25/00* (2006.01)
(Continued)

(52) U.S. Cl.
CPC .......... *H01L 25/50* (2013.01); *H01L 21/4853* (2013.01); *H01L 21/4857* (2013.01);
(Continued)

(58) Field of Classification Search
CPC ............ H01L 25/105; H01L 2224/214; H01L 2225/0651; H01L 2225/06586;
(Continued)

(56) References Cited

U.S. PATENT DOCUMENTS 6,423,405 B1 * 7/2002 Shibuya ............. H01L 21/6835
428/209
6,713,858 B2 3/2004 Kodnani et al.
(Continued)

FOREIGN PATENT DOCUMENTS

JP 2004179578 A 6/2004
JP 2007039547 A 2/2007
(Continued)

OTHER PUBLICATIONS

P. Laurens, M. Ould Bouali, F. Meducin, B. Sadras, Characterization of modifications of polymer surfaces after excimer laser treatments below the ablation threshold, Applied Surface Science, Feb. 2000, 211-216.

*Primary Examiner* — Kyoung Lee
*Assistant Examiner* — Christina A Sylvia
(74) *Attorney, Agent, or Firm* — Muir Patent Law, PLLC

(57) ABSTRACT

A method of manufacturing a semiconductor package includes forming a laser reactive polymer layer on a substrate; mounting a semiconductor device on the substrate; irradiating at least a portion of the laser reactive polymer layer below the semiconductor device with a laser having a wavelength capable of penetrating through the semiconductor device on the substrate to modify the laser reactive polymer layer to have a hydrophilic functional group; and forming a first encapsulation material layer between the semiconductor device and the substrate.

20 Claims, 32 Drawing Sheets

(51) Int. Cl.
  *H01L 25/10* (2006.01)
  *H01L 23/00* (2006.01)
  *H01L 23/31* (2006.01)
  *H01L 23/538* (2006.01)
  *H01L 21/48* (2006.01)
  *H01L 21/78* (2006.01)
  *H01L 25/065* (2006.01)

(52) U.S. Cl.
  CPC ............ *H01L 21/565* (2013.01); *H01L 21/78* (2013.01); *H01L 23/3128* (2013.01); *H01L 23/5383* (2013.01); *H01L 23/5386* (2013.01); *H01L 23/5389* (2013.01); *H01L 24/19* (2013.01); *H01L 24/20* (2013.01); *H01L 25/0657* (2013.01); *H01L 25/105* (2013.01); *H01L 2224/214* (2013.01); *H01L 2225/0651* (2013.01); *H01L 2225/06586* (2013.01); *H01L 2225/1035* (2013.01); *H01L 2225/1041* (2013.01); *H01L 2225/1058* (2013.01)

(58) Field of Classification Search
  CPC ..... H01L 2225/1035; H01L 2225/1041; H01L 2225/1058; H01L 23/49816; H01L 23/49833; H01L 24/13; H01L 24/16; H01L 24/32; H01L 24/48; H01L 24/49; H01L 24/73; H01L 24/81; H01L 2224/13101; H01L 2224/16225; H01L 2224/32145; H01L 2224/32225; H01L 2224/48091; H01L 2224/48227; H01L 2224/73265; H01L 2224/81801; H01L 2224/81909; H01L 21/56; H01L 24/97; H01L 2924/00014; H01L 2924/15311; H01L 2924/181; H01L 2924/18161; H01L 23/293; H01L 23/3135; H01L 24/29

See application file for complete search history.

(56) References Cited

U.S. PATENT DOCUMENTS

| | | | |
|---|---|---|---|
| 7,316,974 | B2 | 1/2008 | Uehara et al. |
| 8,373,284 | B2 | 2/2013 | Ogatsu |
| 9,054,234 | B2 | 6/2015 | Lee et al. |
| 9,076,920 | B2 | 7/2015 | Ferstl et al. |
| 2011/0287980 | A1 | 11/2011 | Asplund et al. |
| 2016/0049381 | A1* | 2/2016 | Ryu ................... H05K 3/3494 438/125 |
| 2017/0301560 | A1* | 10/2017 | Yoon ................... H01L 21/4853 |
| 2018/0096975 | A1* | 4/2018 | Hua .................... H01L 25/105 |
| 2021/0272887 | A1* | 9/2021 | St. Amand .......... H01L 25/0652 |

FOREIGN PATENT DOCUMENTS

| | | |
|---|---|---|
| JP | 2007150221 A | 6/2007 |
| JP | 4765530 B2 | 9/2011 |
| JP | 2018195599 A | 12/2018 |
| KR | 1020150051819 A | 5/2015 |
| KR | 101894603 B1 | 9/2018 |

* cited by examiner

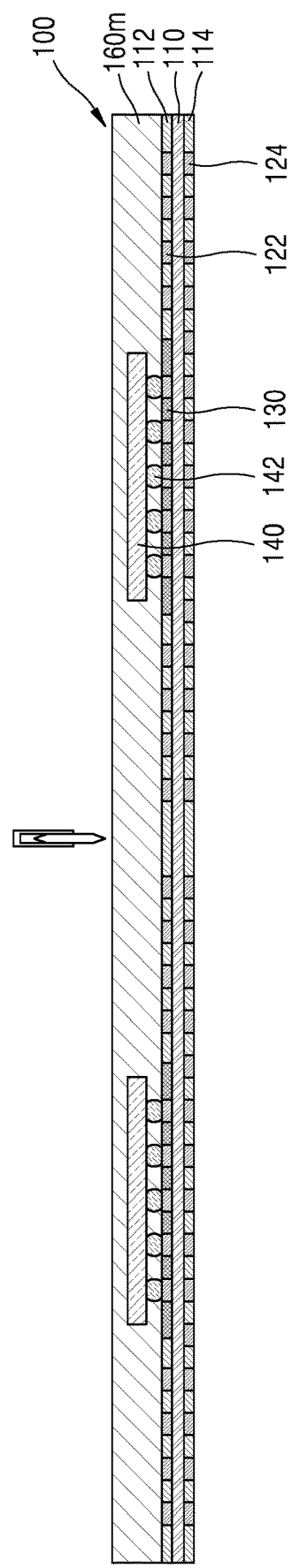

METHODS OF MANUFACTURING SEMICONDUCTOR PACKAGE AND PACKAGE-ON-PACKAGE

CROSS-REFERENCE TO RELATED APPLICATION

This application claims the benefit of Korean Patent Application No. 10-2020-0013728, filed on Feb. 5, 2020, in the Korean Intellectual Property Office, the disclosure of which is incorporated herein in its entirety by reference.

BACKGROUND

The inventive concept relates to methods of manufacturing a semiconductor package and a package-on-package, and more particularly, to methods of manufacturing a highly reliable semiconductor package and a package-on-package.

When mounting a semiconductor chip on a substrate to manufacture a semiconductor package, the gap between the semiconductor chip and the substrate is decreasing. Due to the narrowed gap between the semiconductor chip and the substrate, hydrophilization treatment through plasma treatment becomes more difficult in a space between the semiconductor chip and the substrate, and it becomes more difficult to form an underfill material layer in the space.

SUMMARY

The inventive concept provides a method of manufacturing a highly reliable semiconductor package.

According to an aspect of the inventive concept, there is provided a method of manufacturing a semiconductor package including forming a laser reactive polymer layer on a substrate; mounting a semiconductor device on the substrate; irradiating at least a portion of the laser reactive polymer layer below the semiconductor device with a laser having a wavelength capable of penetrating through the semiconductor device on the substrate to modify the laser reactive polymer layer to have a hydrophilic functional group; and forming a first encapsulation material layer between the semiconductor device and the substrate.

According to another aspect of the inventive concept, there is provided a method of manufacturing a package-on-package (PoP) including manufacturing a first package; and mounting a second package on the first package, wherein the manufacturing of the first package includes forming a laser reactive polymer layer on the first substrate; mounting a first semiconductor device on the first substrate; after the mounting of the first semiconductor device, hydrophilizing at least a part of a region of the laser reactive polymer layer overlapping the first semiconductor device; and forming a first encapsulation material layer between the first semiconductor device and the first substrate.

According to another aspect of the inventive concept, there is provided a method of manufacturing a semiconductor package including forming a laser reactive polymer layer on a substrate; providing an interposer on the substrate; providing a first semiconductor device on the substrate to at least partially overlap the laser reactive polymer layer; irradiating an upper surface of the first semiconductor device with a laser; forming a first encapsulation material layer to surround upper, lower, and side surfaces of the first semiconductor device after the irradiating of the upper surface of the first semiconductor device; and attaching a second semiconductor device on the interposer.

BRIEF DESCRIPTION OF THE DRAWINGS

Embodiments of the inventive concept will be more clearly understood from the following detailed description taken in conjunction with the accompanying drawings in which:

FIGS. 3A to 3M are side cross-sectional views illustrating a method of manufacturing a package-on-package (PoP) package according to an embodiment;

DETAILED DESCRIPTION OF THE EMBODIMENTS

Figure 1:
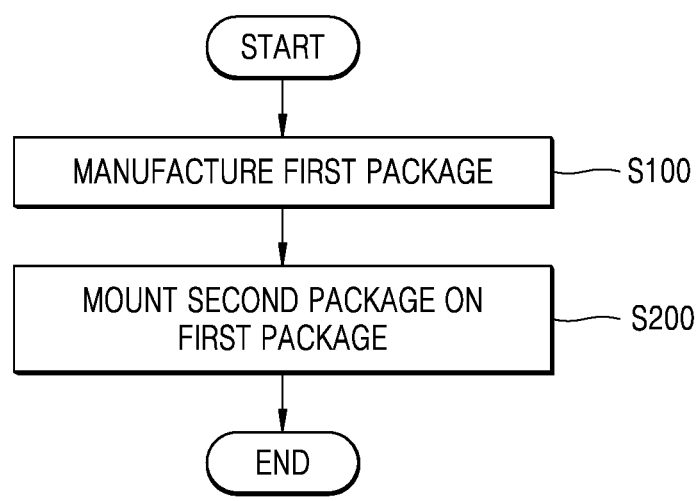
FIG. 1 is a flowchart illustrating a method of manufacturing a semiconductor package, according to an embodiment.

Hereinafter, embodiments of the inventive concept will be described in detail with reference to the accompanying drawings. The same reference numerals are used for the same elements in the drawings, and redundant descriptions thereof are omitted.

FIG. 1 is a flowchart illustrating a method of manufacturing a semiconductor package, according to an embodiment.

Referring to FIG. 1, the semiconductor package may be a package-on-package (PoP) type package. In order to manufacture the PoP type package, a first package may be manufactured (S100), and a second package may be mounted on the first package (S200).

Figure 2:
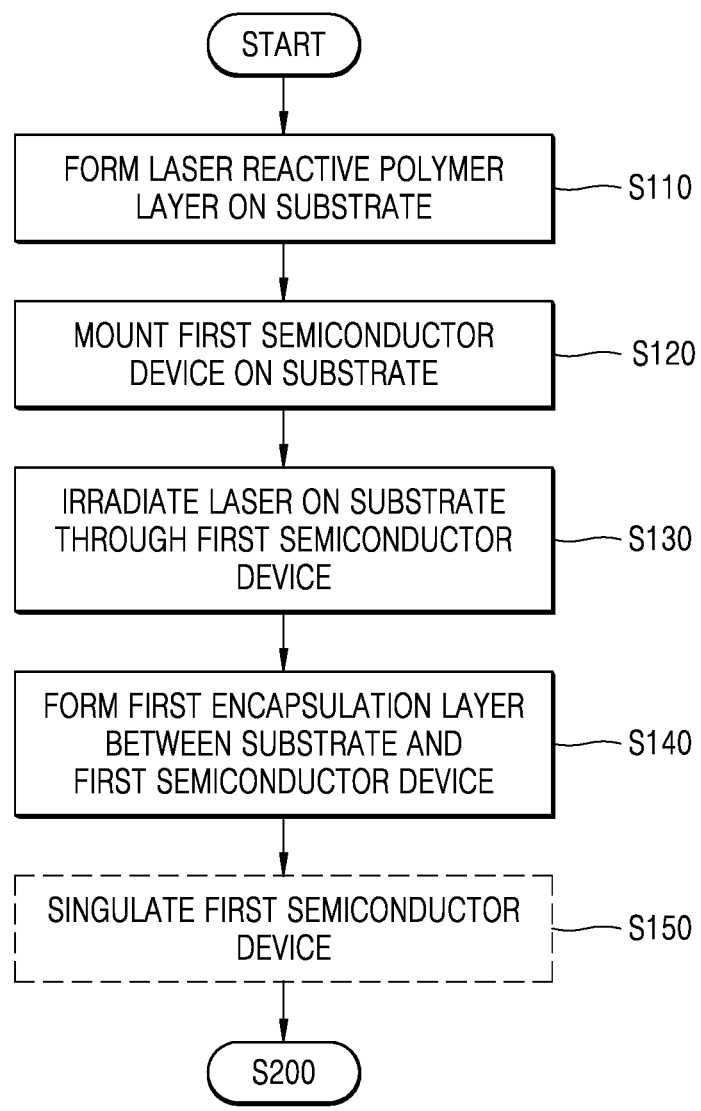
FIG. 2 is a flowchart illustrating operation S100 of FIG. 1 in more detail.

FIG. 2 is a flowchart illustrating operation S100 of FIG. 1 in more detail. FIGS. 3A to 3M are side cross-sectional views illustrating a method of manufacturing a PoP package, according to an embodiment.

Referring to FIGS. 1, 2, and 3A to 3E, a laser reactive polymer layer 130*p* is formed on a substrate 111 for mounting a first semiconductor device (S110).

Figure 3A:
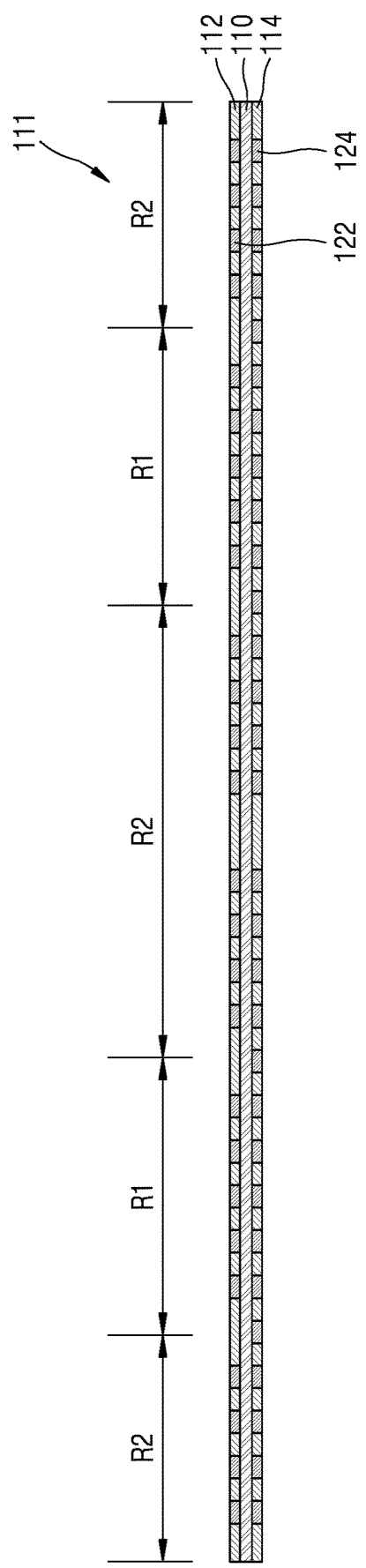

Referring to FIG. 3A, the substrate 111 includes a first region R1 on which the first semiconductor device is intended to be mounted and a second region R2 outside the first region R1. From a top down view, the second region R2 may surround the first region R1. It should be appreciated that use of the singular form of an object/element in this application (e.g., "first region R1") may apply to all of a plurality of like objects/elements (e.g., to all of plural first regions R1, such as those shown in the figures) unless context dictates otherwise.

In some embodiments, the substrate 111 may include a base board layer 110 and an upper pad 122 and a lower pad 124 disposed on upper and lower surfaces of the base board layer 110, respectively.

In some embodiments, the substrate 111 may be a printed circuit board (PCB). For example, the substrate 111 may be a multi-layer PCB. The base board layer 110 may include at least one material selected from phenol resin, epoxy resin, and polyimide. The base board layer 110 may include at least one material selected from, for example, Frame Retardant 4 (FR4), tetrafunctional epoxy, polyphenylene ether, epoxy/polyphenylene oxide, bismaleimide triazine (BT), Thermount, cyanate ester, polyimide, and liquid crystal polymer.

An upper surface solder resist layer 112 and a lower surface solder resist layer 114 exposing the upper pad 122 and the lower pad 124 may be formed on upper and lower surfaces of the base board layer 110, respectively. A first semiconductor device 140 (see FIG. 3F) may be connected to the upper pad 122, and an external connection terminal 152 (see FIG. 3M) connected to an external device may be connected to the lower pad 124.

The substrate 111 may include wiring patterns electrically connecting the upper pad 122 and the lower pad 124 and a conductive via electrically connecting the wiring patterns. The wiring pattern may be disposed on the upper surface, the lower surface, and/or the inside of the base board layer 110. The wiring pattern may include, for example, electrolytically deposited (ED) copper foil, rolled-annealed (RA) copper foil, stainless steel foil, aluminum foil, ultra-thin copper foil, sputtered copper, copper alloys, and the like.

The conductive via may be formed to penetrate at least a part of the base board layer 110. In some embodiments, the conductive via may include copper, nickel, stainless steel, or beryllium copper.

Figure 3B:
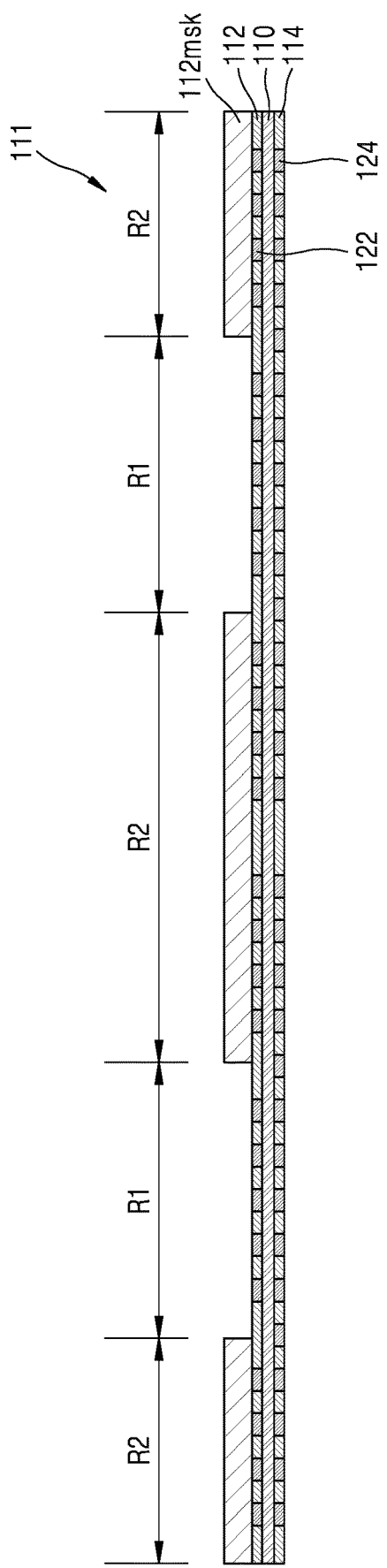

Referring to FIG. 3B, a protection mask 112*msk* is formed having an opening to expose the first region R1 and to cover the second region R2. The upper surface solder resist layer 112 may be removed later in the first region R1 exposed by the opening of the protection mask 112*msk*.

The material constituting the protection mask 112*msk* may be selected considering a solution used for removing the upper surface solder resist layer 112, and may be, for example, silicon oxide, silicon nitride, silicon oxynitride, acid-resistant organic polymer, alkali-resistant organic polymer, etc. However, the inventive concept is not limited thereto.

Figure 3C:
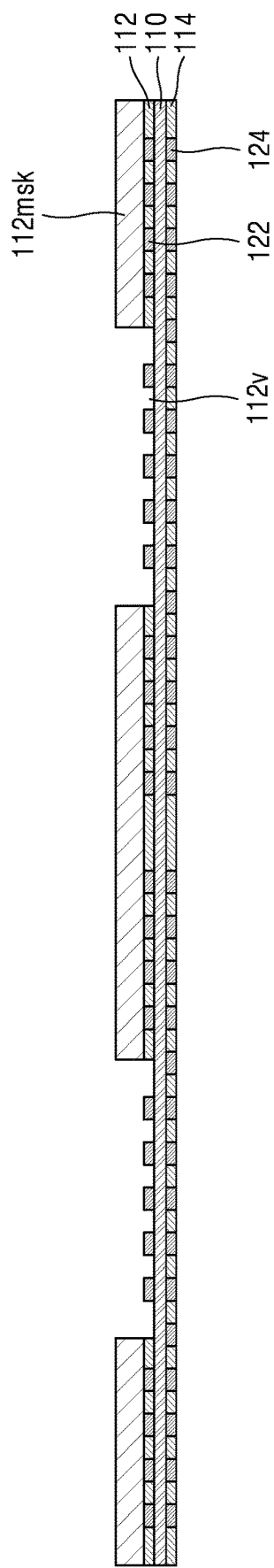

Referring to FIG. 3C, the upper surface solder resist layer 112 of the part exposed by the opening of the protection mask 112*msk* may be removed. The exposed part of the upper surface solder resist layer 112 may be removed by dry or wet etching. When the exposed part of the upper surface solder resist layer 112 is removed by wet etching, an undercut due to wet etching may be formed at a lower end of the edge of the protection mask 112*msk*, and the undercut may have a concave side surface. In some embodiments, an organic solvent, an acid solution, an alkali solution, etc. may be used to selectively remove the upper surface solder resist layer 112.

When the exposed part of the upper surface solder resist layer 112 is removed by dry etching, the exposed part may be removed by anisotropic etching.

Figure 3D:
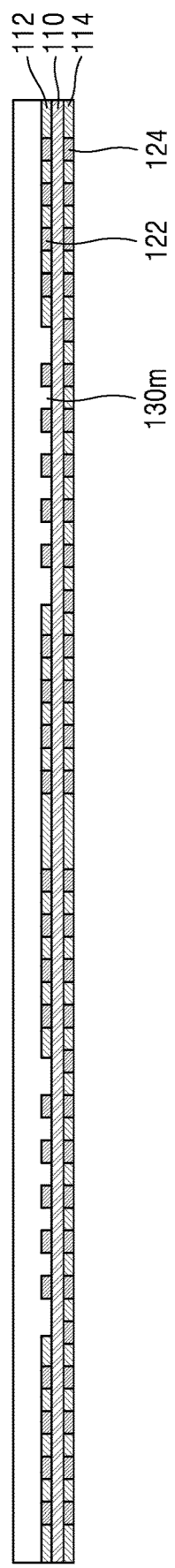

Referring to FIG. 3D, the protection mask 112*msk* may be removed. The protection mask 112*msk* may be removed by dry etching or wet etching. In some embodiments, the protection mask 112*msk* may be removed by an alkali solution, an acid solution, an organic solvent, or a combination thereof.

Thereafter, a laser reactive polymer layer 130*m* may be formed to cover the entire upper surface of the substrate 111. The laser reactive polymer layer 130*m* may be a layer of polymer having properties that are modified in response to electromagnetic waves (i.e., electromagnetic radiation), in particular, electromagnetic waves (e.g., a "laser light" or "laser beam") generated by a laser. In some embodiments, the laser reactive polymer layer 130*m* may have properties that are modified in response to laser light having a wavelength of about 190 nm to about 360 nm.

The laser reactive polymer layer 130*m* may be, for example, an ether-based polymer, a phenol-based polymer, a carbonate ester-based polymer, an epoxy-based polymer, a ketone-based polymer, or a combination thereof.

The laser reactive polymer layer 130*m* may be cured by thermal curing or photocuring after being applied by using a method such as spin coating, doctor blade, screen printing, etc.

Figure 3E:
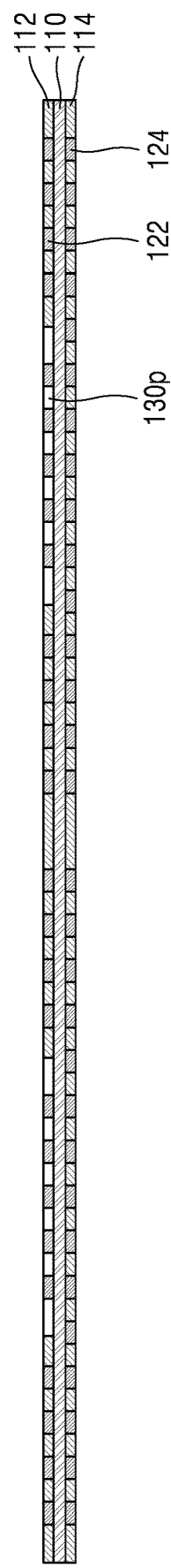

Referring to FIG. 3E, a part of the laser reactive polymer layer 130*m* may be removed so that the upper surface of the upper surface solder resist layer 112 is exposed. The portion of the laser reactive polymer layer 130*m* that is above the upper surface of the solder resist layer 112 may be removed and lower portions of the laser reactive polymer layer 130*m* below the upper surface of the solder resist layer 112 may remain (such as portions deposited between upper pads 122). The removal may be performed, for example, by using a method such as grinding, polishing, etch-back, etc., and the pattern of the laser reactive polymer layer 130*p* may be formed by the removal.

The pattern of the laser reactive polymer layer 130*p* may not overlap the upper surface solder resist layer 112. That is, as illustrated in FIG. 3E, the side surface of the pattern of the laser reactive polymer layer 130*p* and the upper surface solder resist layer 112 may be in contact with each other. In addition, the upper surface of the pattern of the laser reactive polymer layer 130*p* may be substantially coplanar with the upper surface of the upper surface solder resist layer 112. The pattern of the laser reactive polymer layer 130*p* may be disposed between upper pads 122 and surround (e.g., from a top down view) each of the upper pads 122.

Figure 3F:
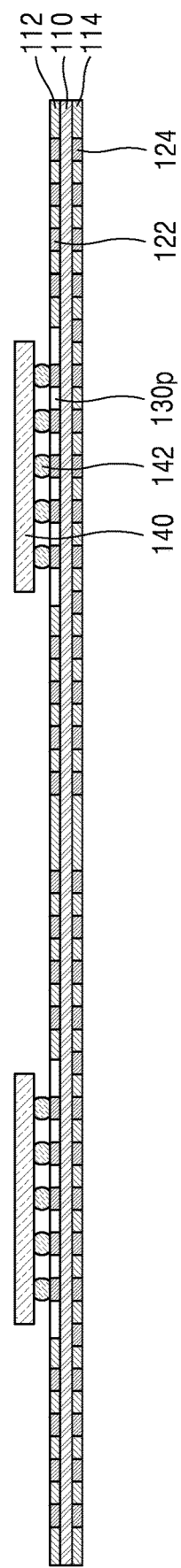

Referring to FIGS. 1, 2, and 3F, the first semiconductor device 140 may be mounted on the substrate 111 (S120).

The first semiconductor device 140 may be, for example, a semiconductor chip (a monolithic integrated circuit), such as a central processing unit (CPU) chip, a graphics processing unit (GPU) chip, or an application processor (AP) chip. In some embodiments, the first semiconductor device 140 may further include, for example, a dynamic random access memory (DRAM) chip, a static random access memory (SRAM) chip, a flash memory chip, an electrically erasable and programmable read-only memory (EEPROM) chip, a phase-change random access memory (PRAM) chip, a magnetic random access memory (MRAM) chip, or a resistive random access memory (RRAM) chip.

The first semiconductor device 140 may be a semiconductor die manufactured from (and cut from) a semiconductor wafer (e.g., silicon wafer), or a semiconductor package in which a semiconductor die is encapsulated in a molding member.

The first semiconductor device 140 may be electrically connected to the upper pad 122 of the first region R1 of the substrate 111 by a connecting member 142. The connecting member 142 may be, for example, a bump, a solder ball, or a conductive pillar. For example, when the first semiconductor device 140 is a semiconductor chip, chip pads (not shown) of the first semiconductor device 140 may be connected to respective upper pads 122 of the first region R1 by respective connecting members 142. When the first semiconductor device 140 is a semiconductor package, pads of the package (i.e., electrical terminals of the package—not shown) may be connected to respective upper pads 122 of the first region R1 by respective connecting members 142.

The first semiconductor device 140 may be mounted to at least partially overlap the pattern of the laser reactive polymer layer 130p. That is, when a mounting region of the first semiconductor device 140 is projected in a direction perpendicular to the upper surface of the substrate 111, the projected region may overlap at least partially with the pattern of the laser reactive polymer layer 130p. In FIG. 3F, the pattern of the laser reactive polymer layer 130p is shown to be larger than the projected region, but in some embodiments, the pattern of the laser reactive polymer layer 130p may be completely included in the projected region.

The first semiconductor device 140 may be mounted spaced apart from the substrate 111 at a predetermined distance. The gap between the first semiconductor device 140 and the substrate 111 may be, for example, about 1 µm to about 80 µm. Because the gap between the first semiconductor device 140 and the substrate 111 is extremely small, it may be difficult to substantially fill the space between the first semiconductor device 140 and the substrate 111 with a general underfill solution or molding resin according to the related art. This may be because the flow of fluid, such as the underfill solution or the molding resin, is subject to a lot of resistance due to a physicochemical force, such as surface tension, because the gap is very small.

Figure 3G:
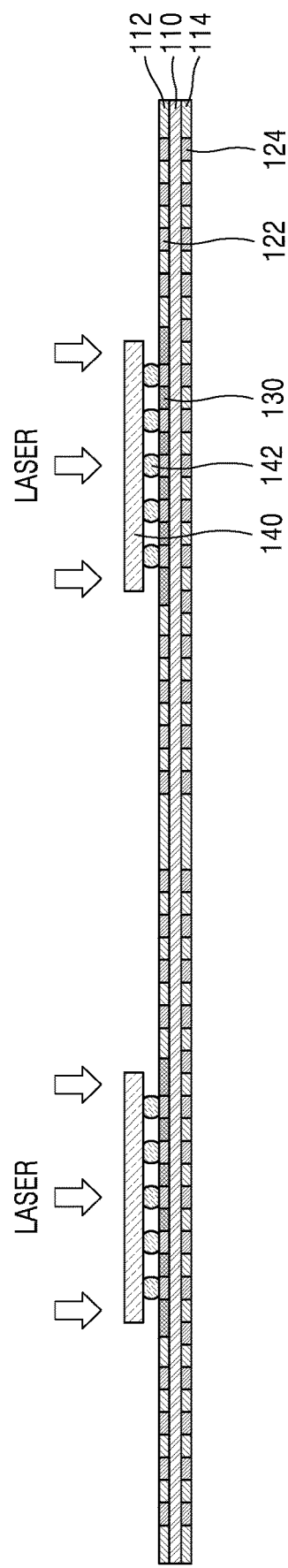

Referring to FIGS. 1, 2, and 3G, electromagnetic waves, produced by a laser, may irradiate the laser reactive polymer layer 130p (S130). For example, the electromagnetic waves may be transmitted through the first semiconductor device 140 to thereby irradiate the laser reactive polymer layer 130p.

As described with reference to FIG. 3F, the pattern of the laser reactive polymer layer 130p may overlap at least partially with the first semiconductor device 140. The electromagnetic waves emitted by the laser may be directly transferred to and irradiate a part of the laser reactive polymer layer 130p that does not overlap with the first semiconductor device 140. The electromagnetic waves emitted by the laser may also penetrate through the first semiconductor device 140 and may be irradiated on to a part of the laser reactive polymer layer 130p that overlaps with the first semiconductor device 140 (e.g., a part of the laser reactive polymer layer 130p below the first semiconductor device 140). Therefore, as result of the irradiation by the laser, the laser reactive polymer layer 130p may be modified to form a hydrophilic functional group at the upper surface of the laser reactive polymer layer 130p. The laser reactive polymer layer 130p may have its upper surface modified to increase its hydrophilicity.

In some embodiments, the laser may have a wavelength from about 190 nm to about 360 nm, and, for example, the laser may be an ArF laser (193 nm), KrF laser (248 nm), XeCl laser (308 nm), XeF laser (351 nm), or a combination thereof. If the wavelength of the laser is too long, the laser reactive polymer layer 130p may be insufficiently modified, and the hydrophilic functional group may not be sufficiently generated. If the wavelength of the laser is too short, the first semiconductor device 140 may be damaged.

Figure 4A:
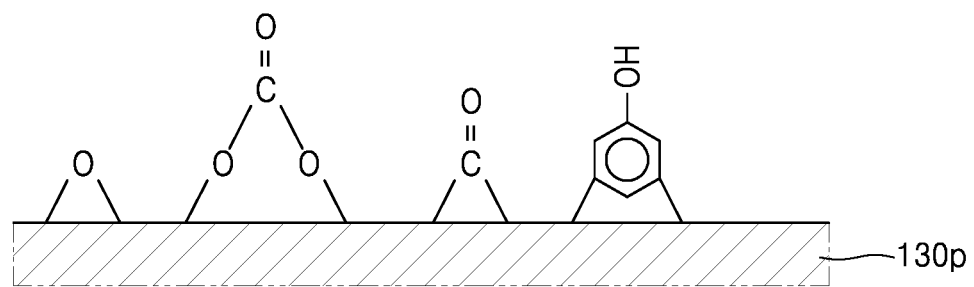
FIGS. 4A and 4B are conceptual diagrams schematically illustrating comparison of before and after modification of a laser reactive polymer layer.
Figure 4B:
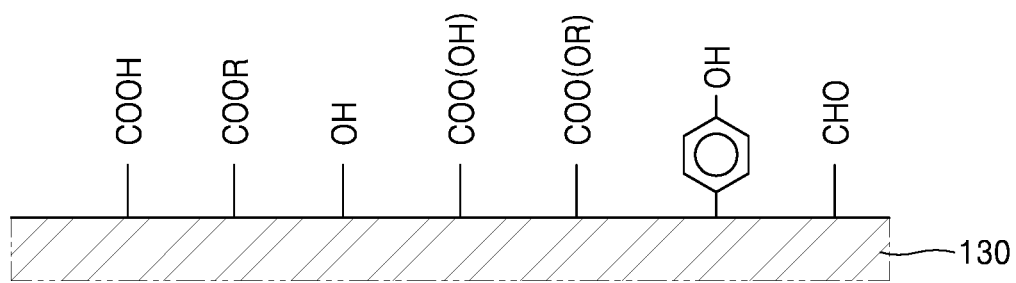

FIGS. 4A and 4B are conceptual diagrams schematically illustrating before and after comparison of modification of the laser reactive polymer layer 130p.

A hydrophilic functional group may be formed on the surface of the laser reactive polymer layer 130p (i.e., the laser reactive polymer layer 130p may include a hydrophilic functional group at its upper surface), by energy received by electromagnetic waves. That is, a laser reactive polymer on the surface may be excited by the energy, and a chemical reaction may occur to some moieties or segments in the polymer, and thus the hydrophilic functional group may be generated. In some embodiments, the hydrophilic functional group may be at least one of a carboxyl group, an ester group, an epoxy group, a carbonyl group, a phenol group, an aldehyde group, and a peroxide group.

Referring to FIG. 4A, the laser reactive polymer layer 130p, before the surface thereof is modified, represents main moieties of an ether-based polymer, a phenol-based polymer, a carbonate ester-based polymer, and a ketone-based polymer. These moieties are relatively hydrophobic or weakly hydrophilic and may have relatively insufficient affinity with an underfill solution or a molding resin. In some embodiments, the laser reactive polymer layer 130p may include polyetheretherketone (PEEK), polycarbonate (PC), etc. In some embodiments, the laser reactive polymer layer 130p may include an epoxy resin that is a copolymer of diglycyl ether bisphenol A (DGEBA) and diethylenetriamine (DETA).

If the polymer is irradiated by the laser as described above schematically in FIG. 4A, the laser reactive polymer layer 130 with the modified surface may be generated, and hydrophilic functional groups as shown in FIG. 4B may be generated on the surface of the laser reactive polymer layer 130. That is, at least one of the carboxyl group, the ester group, the epoxy group, the carbonyl group, the phenol group, the aldehyde group, and the peroxide group may be generated on the surface of the laser reactive polymer layer 130.

In FIG. 4B, R may be a linear or branched alkyl group having carbon atoms in the amount of 1 to 20, a substituted or unsubstituted cycloalkyl group having carbon atoms in the amount of 3 to 12, a substituted or unsubstituted aryl group having carbon atoms in the amount of 6 to 40, a substituted or unsubstituted aralkyl group having carbon atoms in the amount of 7 to 15, or an alkynyl group having carbon atoms in the amount of 2 to 20.

Referring back to FIG. 3G, the irradiation may occur in an atmospheric atmosphere or in an inert atmosphere. The inert atmosphere may be, for example, helium (He), neon (Ne), argon (Ar), or nitrogen ($N_2$) atmosphere.

In some embodiments, only a region where the laser reactive polymer layer 130 is formed is irradiated. In some other embodiments, the entire upper surface of the substrate 111 may be irradiated.

According to the related art, the surface of a substrate is modified to be hydrophilic by plasma treatment, but the effect of modifying the surface of the substrate hydrophilically may be non-uniform as the gap between the substrate and a semiconductor device is narrowed. However, as in the embodiments of the inventive concept, if a laser reactive polymer layer is formed before mounting a semiconductor device and irradiation by the laser is performed after mounting the semiconductor device, the surface of the substrate may be uniformly modified hydrophilically regardless of a location.

Referring to FIGS. 1, 2, and 3H, a first encapsulation material layer 160m may be formed between the substrate 111 and the first semiconductor device 140 (S140). In some embodiments, the first encapsulation material layer 160m may be formed to surround and contact an upper surface, a lower surface, and a side surface of the first semiconductor device 140. In some other embodiments, the first encapsulation material layer 160*m* may be formed to contact the entire lower surface of the first semiconductor device 140 (except where connecting members 142 contact the lower surface of the first semiconductor device 140).

As described above with reference to FIG. 3G, because the hydrophilic functional groups are uniformly formed on the lower portion of the first semiconductor device 140 at a high concentration due to the modification of the laser reactive polymer layer 130, the first encapsulation material layer 160*m* may penetrate the areas below the first semiconductor device 140 more easily, including between adjacent connecting members 142 to surround and encapsulate each of the connecting members 142 (contacting side surfaces of connecting members 142). Accordingly, the space between the first semiconductor device 140 and the upper surface solder resist layer 112 may be filled better, and the reliability of a semiconductor package manufactured therefrom may be increased.

The first encapsulation material layer 160*m* may be a general underfill material, or may be a general molding material such as an epoxy molding compound (EMC). In some examples, the first encapsulation material layer 160*m* may comprise an underfill material that fills the space between the space between the first semiconductor device 140 and the upper surface solder resist layer 112 (surrounding and encapsulating the connecting members 142) and one or more additional encapsulation materials may be formed thereon (e.g., adjacent to and contacting side surfaces and/or the top surface of the first semiconductor device).

Thereafter, manufacture of the first package 100 may be completed by performing singulation (S150) (to separate the first packages 100 from one another). The singulation may be performed by using a method such as mechanical sawing or laser sawing (graphically represented in the FIG. 3H at the center of the top surface of the first encapsulation material layer 160*m*), and is not particularly limited thereto. It will be appreciated that while FIG. 3H shows two first packages 100, the manufacturing process may be performed to form more than two first packages 100 which may be arranged (prior to singulation) in a two dimensional array (with respect to a top down view).

Figure 3I:
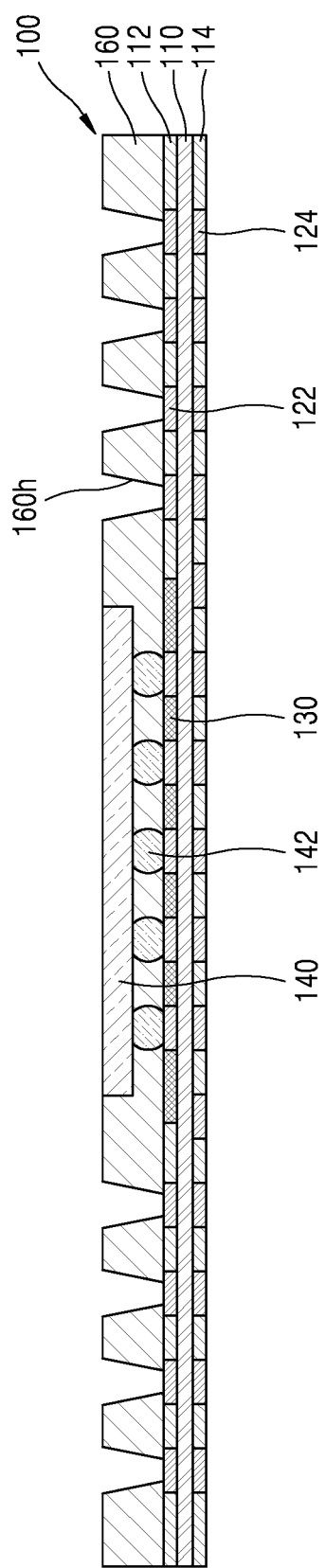

Referring to FIG. 3I, via holes 160*h* may be formed by removing parts of the first encapsulation layer 160 such that some of the upper pads 122 are exposed. Removal of the parts of the first encapsulation layer 160 may be performed, for example, by using a method such as laser drilling.

In addition, a package thinning process may be performed by removing an upper portion of the first encapsulation material layer 160*m*. The package thinning process may expose the upper surface of the first semiconductor device 140 (such as by a planarization process, such as CMP). Accordingly, the overall thickness of the first package 100 may be further reduced. In addition, heat dissipation of the first semiconductor device 140 may also be performed more smoothly. This thinning process may alternatively be performed prior to singulation of the first packages 100.

In some embodiments, before forming the first encapsulation material layer 160*m*, a connecting member including a conductor, such as a solder ball, may be first attached to some of the upper pads 122. In this case, the connecting member may be exposed instead of the upper pad 122 by the formation of the via hole 160*h* and/or through the thinning process.

Figure 3J:
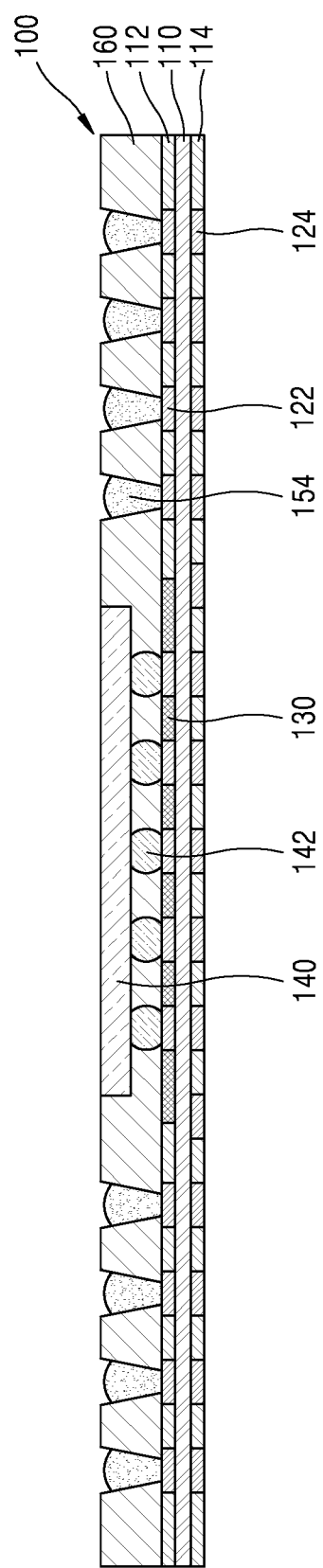

Referring to FIG. 3J, a connecting member 154 may be formed in the via hole 160*h*. The connecting member 154 may be formed by using various methods, for example, arranging and reflowing the conductor such as the solder ball, or forming and plating a seed layer (e.g., electroplating). Although the upper surface of the connecting member 154 is shown to be convex in FIG. 3J, the connecting member 154 may have a flat upper surface to be substantially coplanar with the upper surface of the first encapsulation layer 160.

Figure 3K:
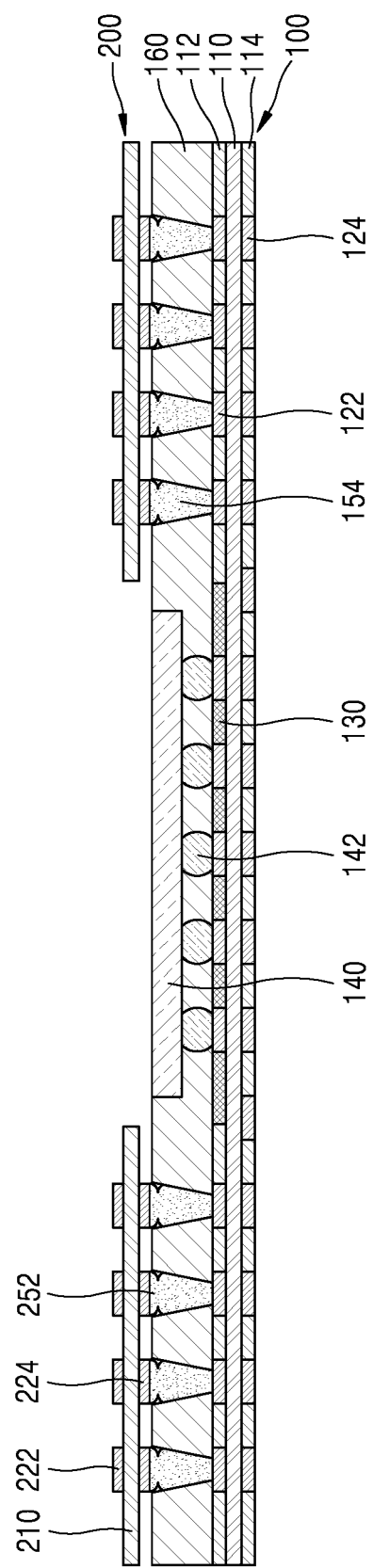

Referring to FIG. 3K, an interposer 200 may be disposed to be electrically connected to the connecting member 154.

The interposer 200 may include an interposer substrate 210, an upper pattern 222 disposed on the upper surface of the interposer substrate 210, a lower pattern 224 disposed on the lower surface of the interposer substrate 210, and a connecting member 252 attached to the lower pattern 224.

The interposer substrate 210 may be a semiconductor substrate. For example, the interposer substrate 210 may include silicon (Si). The upper pattern 222 and the lower pattern 224 may be formed on the interposer substrate 210 by applying a wiring process of a usual semiconductor device. The upper pattern 222 and the lower pattern 224 may include connection line wirings forming one layer, but are not limited thereto. In some embodiments, the upper pattern 222 and the lower pattern 224 may include connection line wirings forming two or more layers, and via plugs connecting between the connection line wirings of other layers, and an interlayer insulation layer may be formed between the line wiring and the via plug. The interposer 200 may be formed by performing only a wiring process without forming individual electronic elements on a semiconductor substrate.

The connecting member 252 may be, for example, a bump, a solder ball, or a conductive pillar.

Figure 3L:
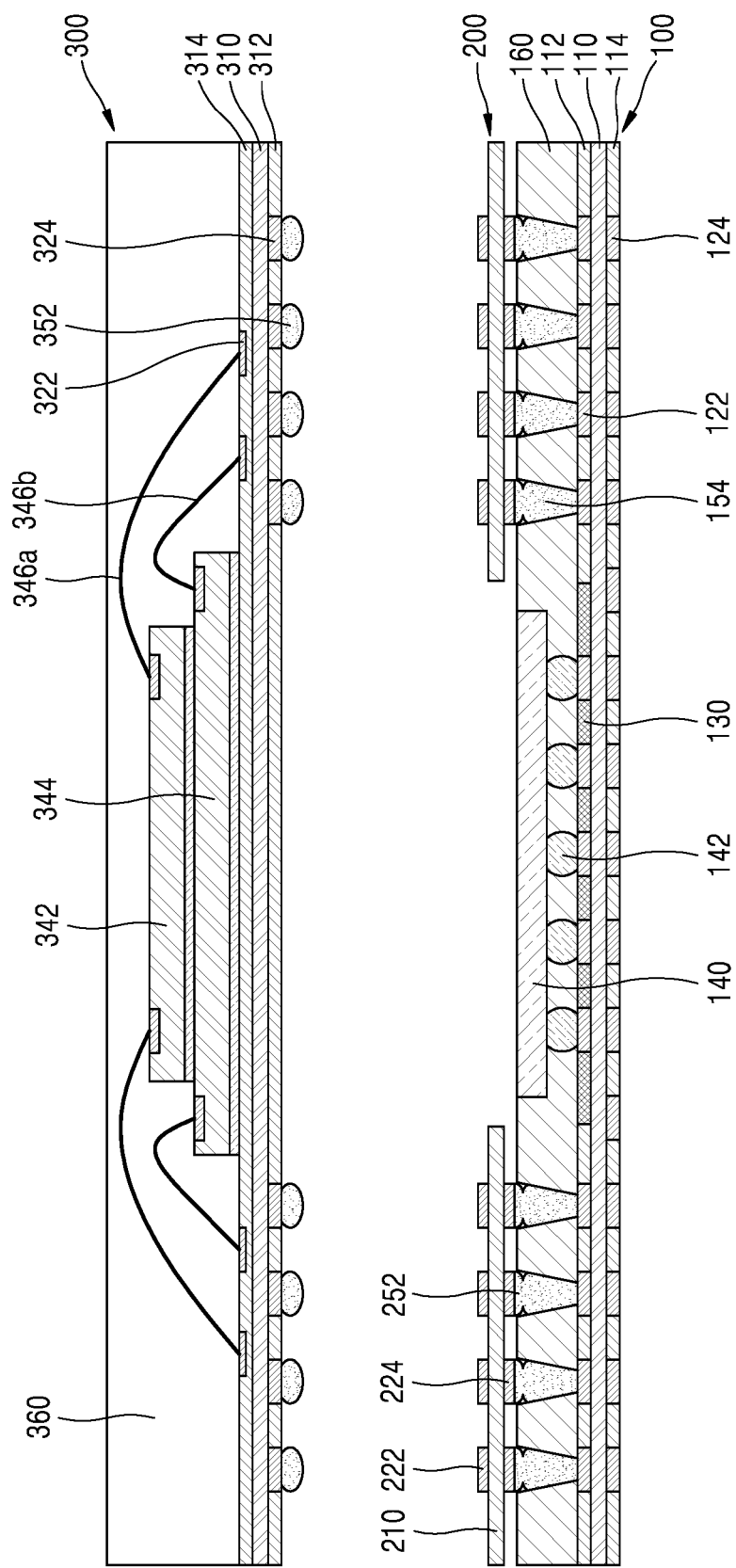

Referring to FIG. 3L, a second package 300 to be attached to the upper portion of the interposer 200 may be prepared.

The second package 300 may include one or more semiconductor devices mounted on a package substrate.

The package substrate may include a base board layer 310 and an upper pad 322 and a lower pad 324 disposed on the upper and lower surfaces of the base board layer 310, respectively. In addition, an upper surface solder resist layer 314 and a lower surface solder resist layer 312 exposing the upper pad 322 and the lower pad 324 may be formed on the upper and lower surfaces of the base board layer 310, respectively. These are the same as the base board layer 110, the upper pad 122, the lower pad 124, the upper surface solder resist layer 112 and the lower surface solder resist layer 114, respectively, of the first package 100, and thus redundant descriptions thereof are omitted.

A second semiconductor device 344 and a third semiconductor device 342 may be sequentially stacked on the package substrate. These may be electrically connected to the package substrate through bonding wires 346*b* and 346*a*, respectively.

A connecting member 352 for electrical connection with the interposer 200 may be provided on the lower pad 324. The connecting member 352 may be, for example, a bump, a solder ball, or a conductive pillar.

Figure 3M:
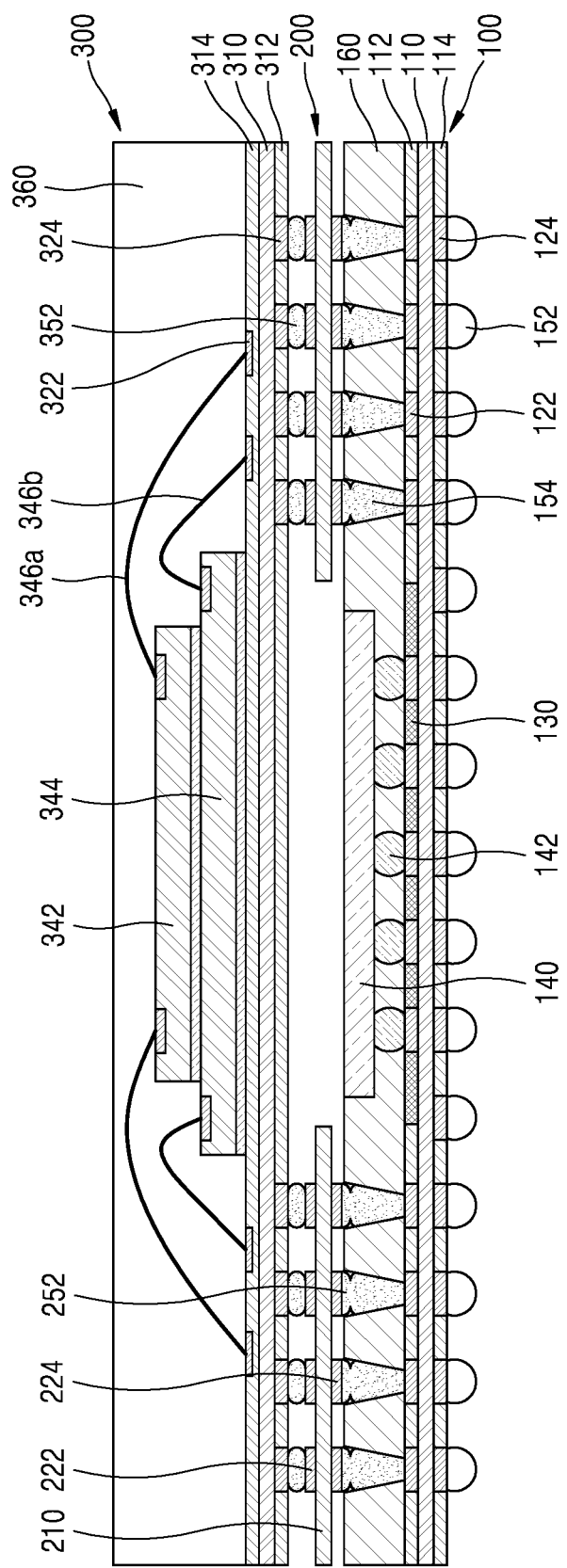

Referring to FIG. 3M, the second package 300 may be attached to the interposer 200, and the external connection terminal 152 may be attached to the lower pad 124 of the first package 100.

Figure 5A:
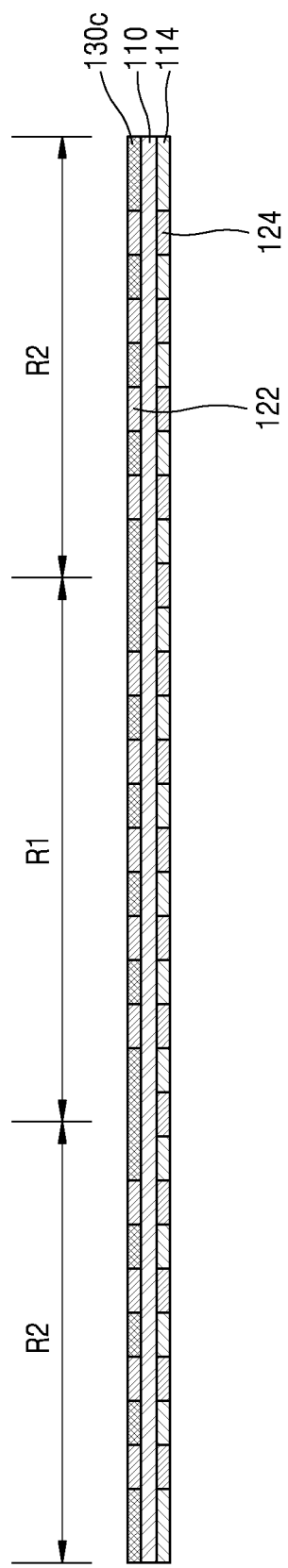
FIGS. 5A to 5C are side cross-sectional views illustrating a method of manufacturing a PoP, according to another embodiment.
Figure 5B:
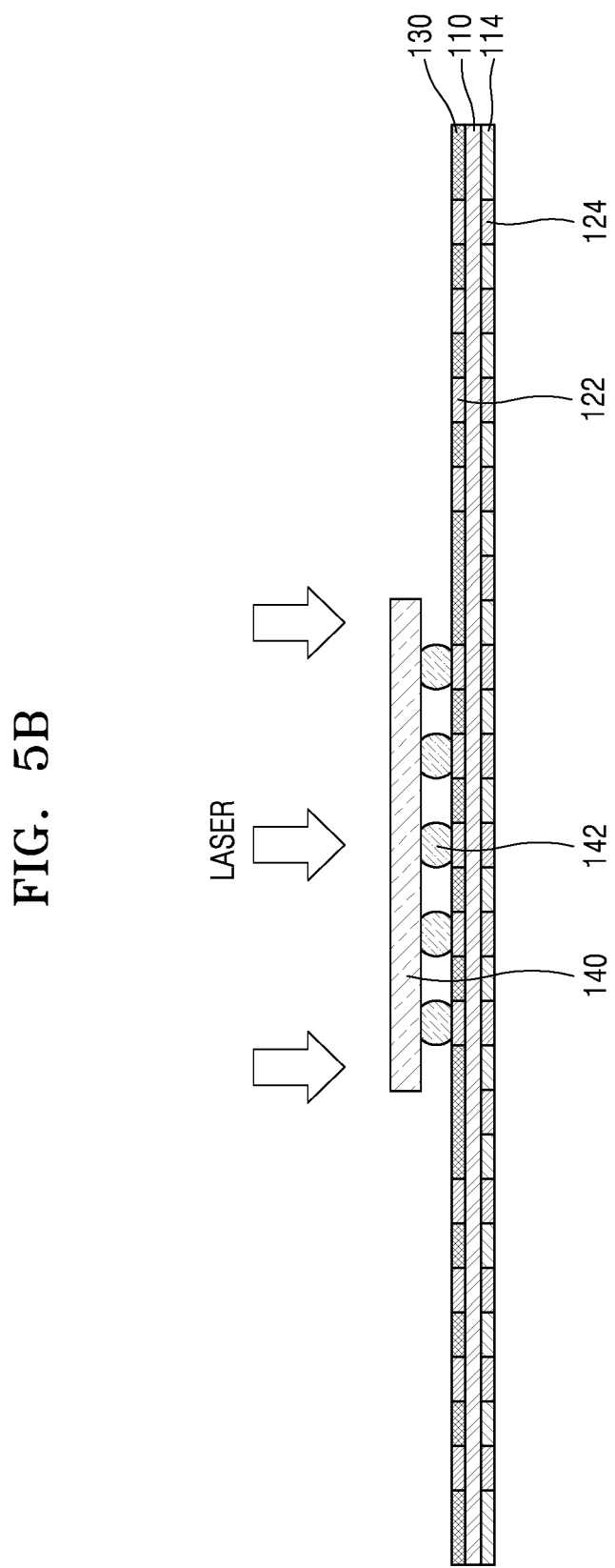
Figure 5C:
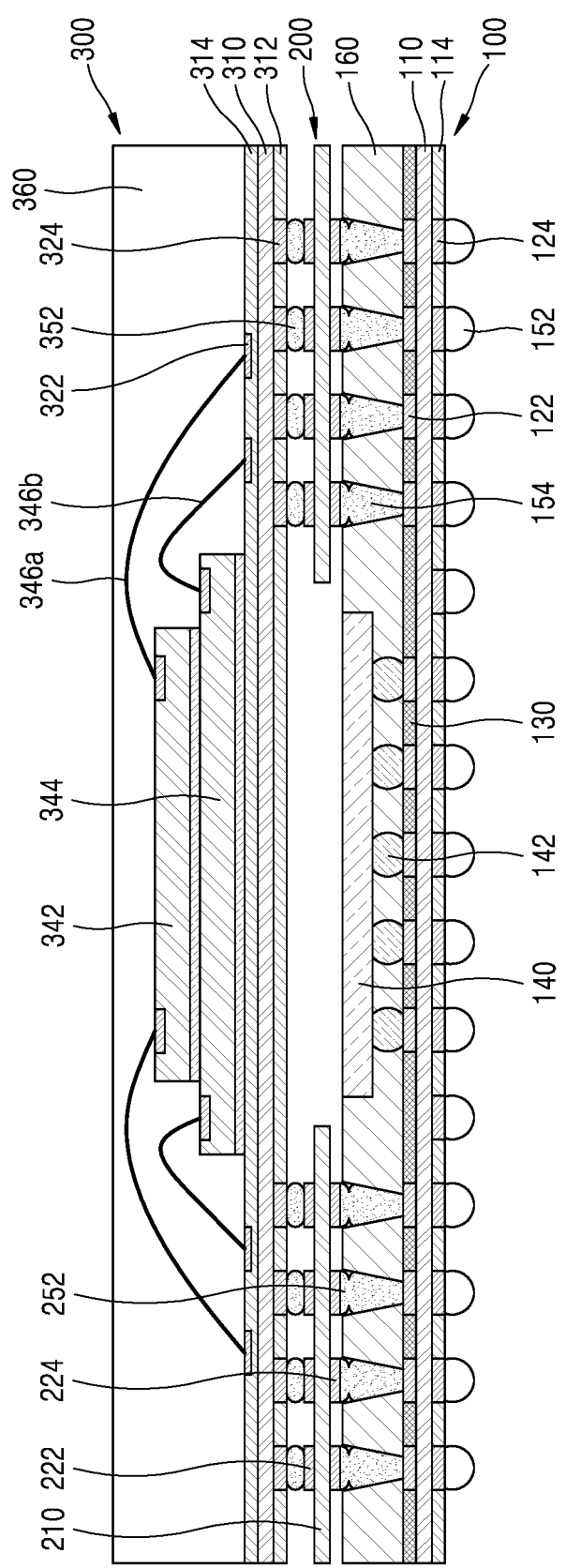

FIGS. 5A to 5C are side cross-sectional views illustrating a method of manufacturing a PoP, according to another embodiment.

The embodiment of FIGS. 5A to 5C is different in that a laser reactive polymer composite layer 130*c* is provided instead of forming a pattern of a laser reactive polymer layer in comparison with the embodiment described with reference to FIGS. 3A to 3M. Therefore, hereinafter, the differences will be mainly described, and redundant descriptions may be omitted for brevity.

Referring to FIG. 5A, the laser reactive polymer composite layer 130c is provided on a substrate instead of the upper surface solder resist layer 112 (see FIG. 3A). The laser reactive polymer composite layer 130c may be a layer obtained by mixing and complexing the laser reactive polymer described above and a solder resist material in an appropriate ratio, such as 30:70 to 70:30, or 40:60 to 60:40 by weight.

Because the laser reactive polymer composite layer 130c includes a component of a solder resist, the laser reactive polymer composite layer 130c may have properties required as the solder resist. In addition, because the laser reactive polymer composite layer 130c includes the laser reactive polymer, a hydrophilic functional group may be generated on the surface thereof when irradiated by the laser.

Referring to FIG. 5B, after mounting the first semiconductor device 140, the laser reactive polymer composite layer 130c may be modified to form the laser reactive polymer layer 130 with the hydrophilic functional group formed on the surface thereof as a result of irradiation by the laser.

Referring to FIG. 5C, the PoP package may be manufactured through similar operations as described with reference to FIGS. 3H to 3M. The PoP package of FIG. 5C differs in that instead of the upper surface solder resist layer 112 (see FIG. 3A) the surface is modified to form the laser reactive polymer layer 130 with the hydrophilic functional group formed on the surface.

Figure 6A:
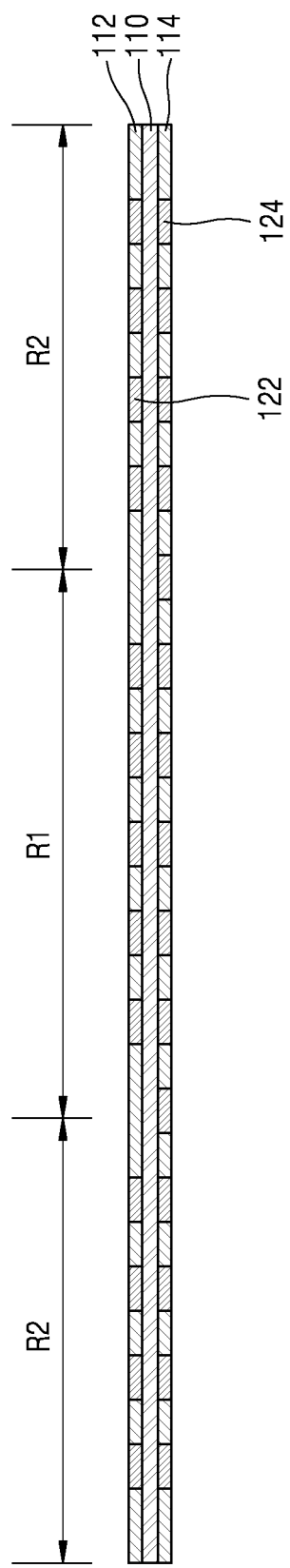
FIGS. 6A to 6C are side cross-sectional views illustrating a method of manufacturing a PoP, according to another embodiment.
Figure 6B:
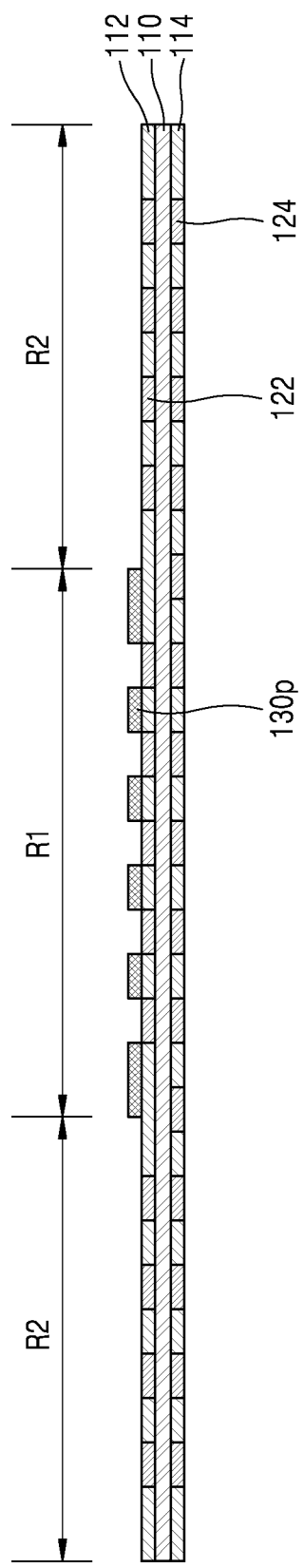
Figure 6C:
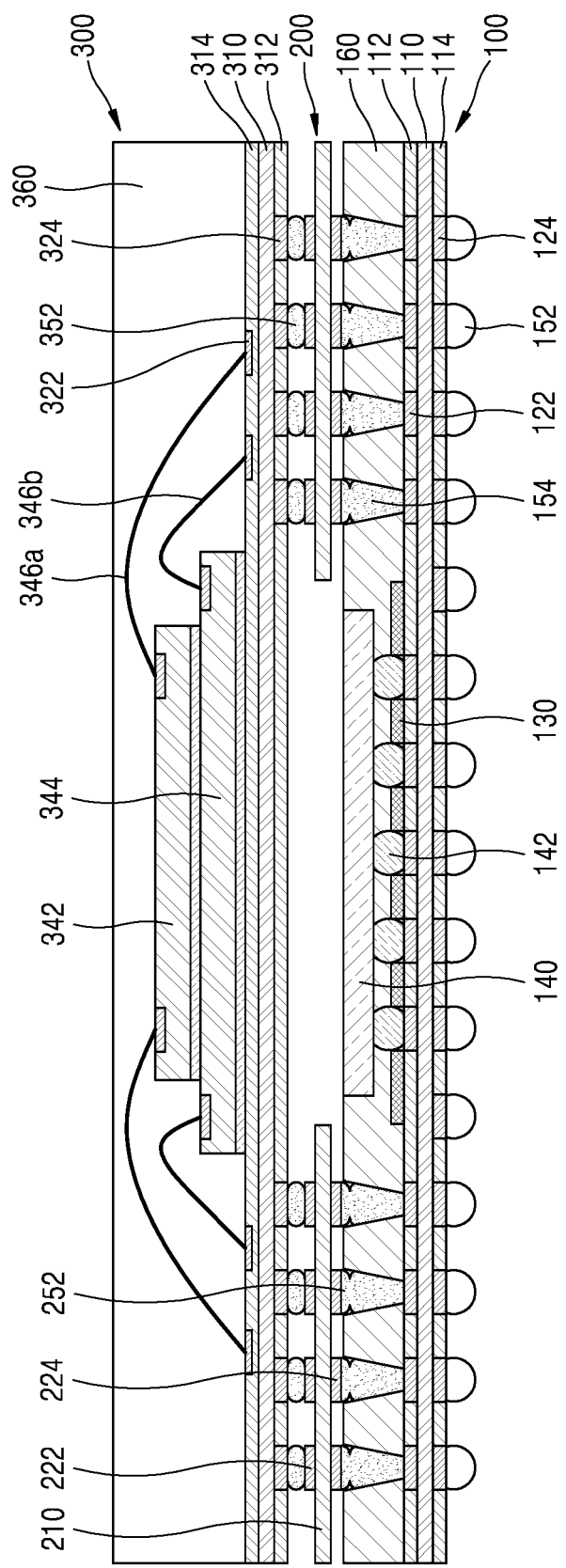

FIGS. 6A to 6C are side cross-sectional views illustrating a method of manufacturing a PoP, according to another embodiment.

The embodiment of FIGS. 6A to 6C differs in that a pattern of the laser reactive polymer layer 130p is provided on the upper surface solder resist layer 112 in the first region R1 in comparison with the embodiment described with reference to FIGS. 3A to 3M. Therefore, hereinafter, the differences will be mainly described, and redundant descriptions will be omitted for brevity.

Referring to FIG. 6A, the substrate 111 including the first region R1 and the second region R2 is provided. As described with reference to FIG. 3A, the first region R1 may be a region in which a first semiconductor device is mounted, and the second region R2 may be other regions.

Referring to FIG. 6B, a pattern of the laser reactive polymer layer 130p may be formed on the first region R1. In some embodiments, the pattern of the laser reactive polymer layer 130p may be configured to cover the entire region of the first region R1. In some other embodiments, the pattern of the laser reactive polymer layer 130p may be configured to cover the entire region of the first region R1 and a partial region of the second region R2. In some other embodiments, the pattern of the laser reactive polymer layer 130p may be formed in the first region R1 to have a smaller planar area than the first region R1.

The pattern of the laser reactive polymer layer 130p may be formed to expose the upper pads 122.

Referring to FIG. 6C, the PoP package may be manufactured through similar operations as described with reference to FIGS. 3F to 3M. The PoP package of FIG. 6C differs in that the surface is modified to form the laser reactive polymer layer 130 with a hydrophilic functional group formed on the surface, on the upper surface solder resist layer 112 in the first region R1.

Figure 7A:
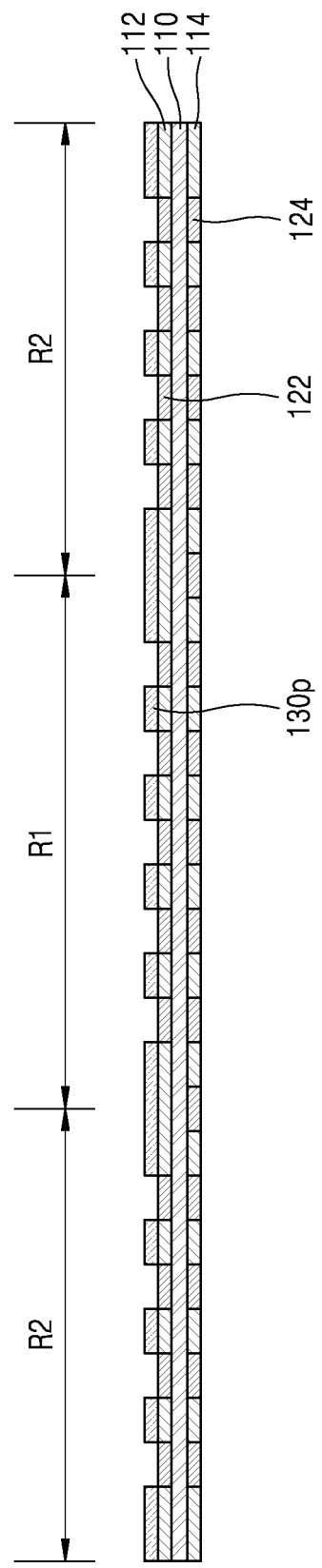
FIGS. 7A and 7B are side cross-sectional views illustrating a method of manufacturing a PoP, according to another embodiment.
Figure 7B:
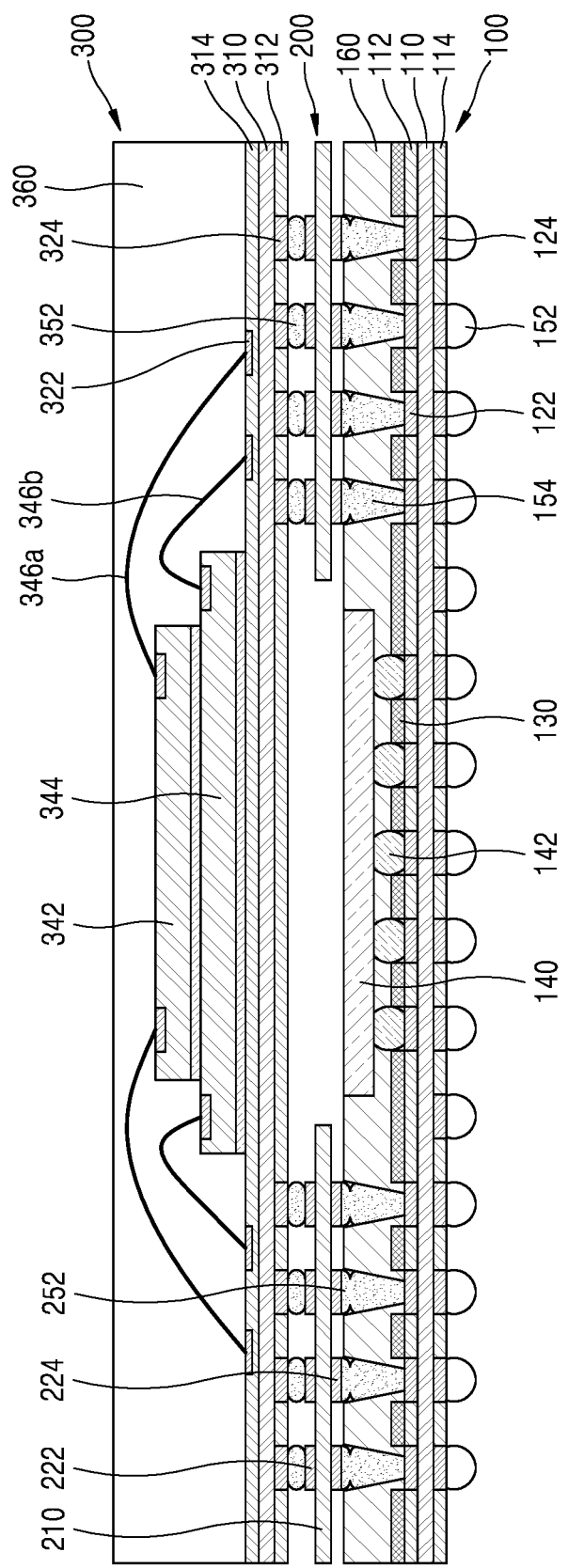

FIGS. 7A and 7B are side cross-sectional views illustrating a method of manufacturing a PoP, according to another embodiment.

The embodiment of FIGS. 7A and 7B differs in that a pattern of the laser reactive polymer layer 130p is provided on the upper surface solder resist layer 112 in the first region R1 and the second region R2 in comparison with the embodiment described with reference to FIGS. 3A to 3M. Therefore, hereinafter, the differences will be mainly described, and redundant descriptions will be omitted for brevity.

Referring to FIG. 7A, the pattern of the laser reactive polymer layer 130p may be formed with respect to the entire region. At this time, the pattern of the laser reactive polymer layer 130p may be formed to expose the upper pads 122. To this end, after forming the laser reactive polymer layer 130p on the entire upper surface of the upper surface solder resist layer 112, the laser reactive polymer layer 130p may be patterned such that the upper pads 122 are exposed, and the pattern of the laser reactive polymer layer 130p may be formed.

Referring to FIG. 7B, the PoP package may be manufactured through similar operations as described with reference to FIGS. 3F to 3M. The PoP package of FIG. 7C differs in that the surface is modified to form the laser reactive polymer layer 130 with a hydrophilic functional group formed on the surface, on the upper surface solder resist layer 112 in the entire region.

FIGS. 8A to 8D are side cross-sectional views illustrating a method of manufacturing a PoP, according to another embodiment.

The embodiment of FIGS. 8A to 8D differs in that a pattern of the laser reactive polymer layer 130p is provided on the upper surface solder resist layer 112 in the first region R1 and the second region R2 and a dam 112dm is formed along the edge of the substrate 111 in comparison with the embodiment described with reference to FIGS. 3A to 3M. Therefore, hereinafter, the differences will be mainly described, and redundant descriptions will be omitted for brevity.

Figure 8A:
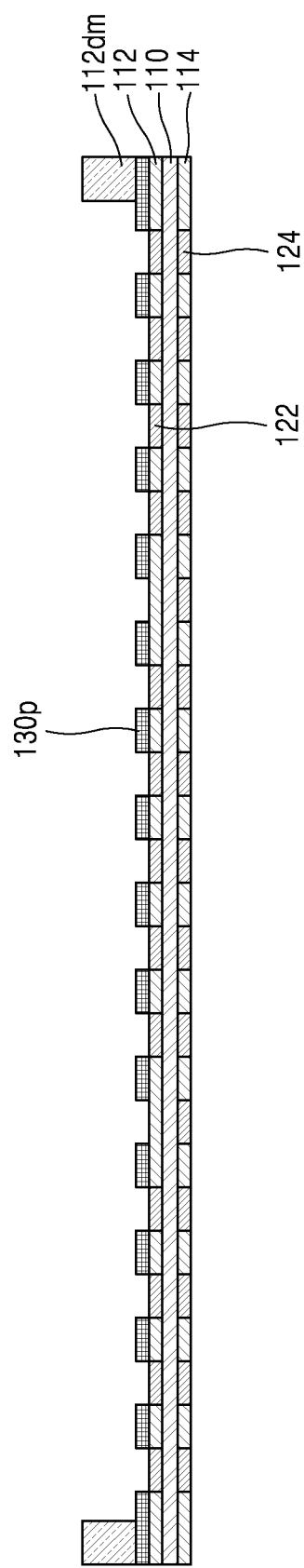
FIGS. 8A to 8D are side cross-sectional views illustrating a method of manufacturing a PoP, according to another embodiment.

Referring to FIG. 8A, the pattern of the laser reactive polymer layer 130p may be formed with respect to the entire region. At this time, the pattern of the laser reactive polymer layer 130p may be formed to expose the upper pads 122.

In addition, the dam 112dm may be formed at a predetermined height along the edge of the substrate 111. The dam 112dm may be provided to prevent an underfill material from leaking outside the region of the substrate 111.

Figure 8B:
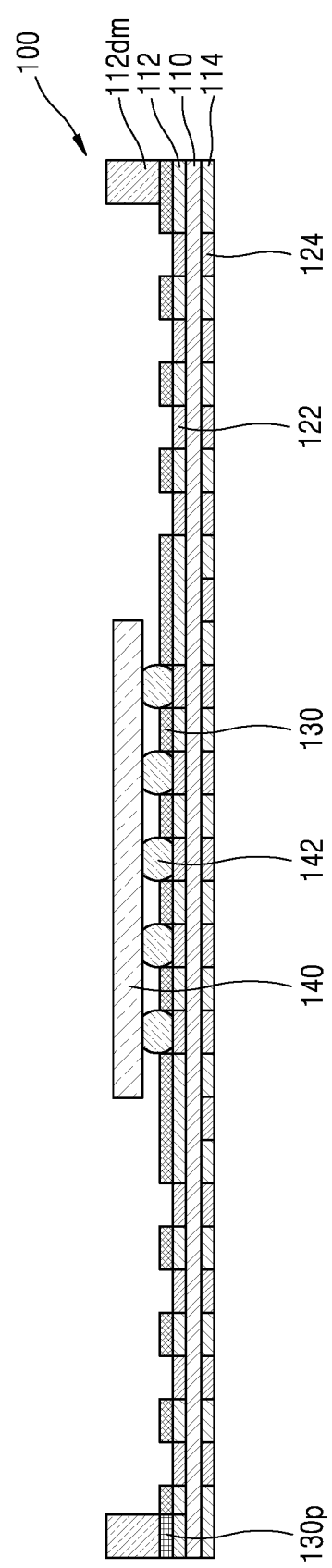

Referring to FIG. 8B, the laser reactive polymer layer 130 and the first semiconductor device 140 may be formed through similar operations as described with reference to FIGS. 3F and 3G. That is, by forming the first semiconductor device 140 so as to be connected to the upper pads 122 and then irradiating, using a laser, the pattern of the laser reactive polymer layer 130p, the laser reactive polymer layer 130 that is modified to have hydrophilic functional groups on the surface thereof may be formed. At this time, a part of the laser reactive polymer layer 130p may be directly irradiated by the laser, and the other part of the laser reactive polymer layer 130p may be irradiated by the laser when the electromagnetic waves emitted by the laser penetrates the first semiconductor device 140. In some embodiments, a part of the dam 112dm may also be irradiated.

In some embodiments, the pattern of the laser reactive polymer layer 130p on the lower portion of the dam 112dm may be modified to generate a hydrophilic functional group on the surface thereof (see the right end of FIG. 8B). In some other embodiments, the pattern of the laser reactive polymer layer 130p on the lower portion of the dam 112dm may remain unmodified by excessively blocking laser light by the dam 112dm (see the left end of FIG. 8B).

Figure 8C:
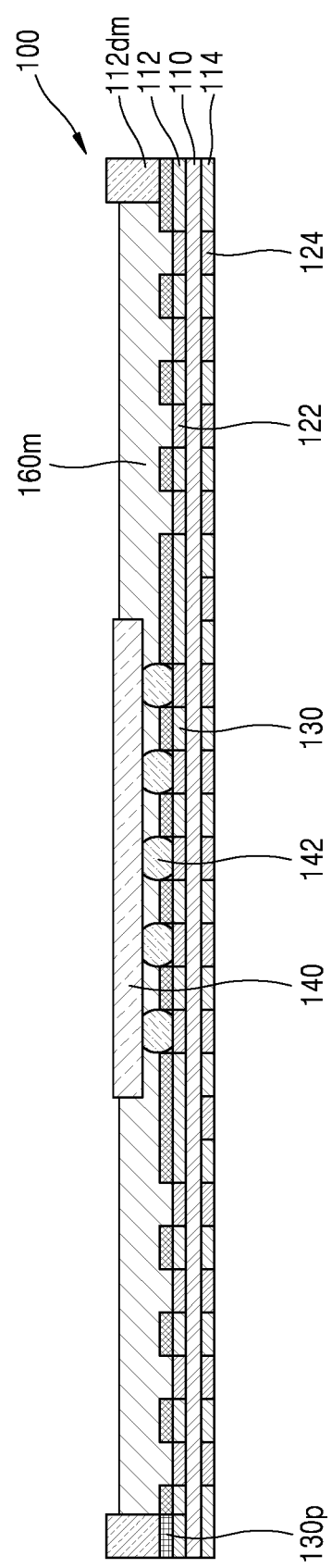

Referring to FIG. 8C, the first encapsulation material layer 160m may be formed between the first semiconductor device 140 and the laser reactive polymer layer 130. In spite of a narrow gap between the first semiconductor device 140 and the laser reactive polymer layer 130, because the laser reactive polymer layer 130 uniformly formed with hydrophilic groups is on the lower portion of the first semiconductor device 140, the first encapsulation material layer 160m may be excellently formed.

Figure 8D:
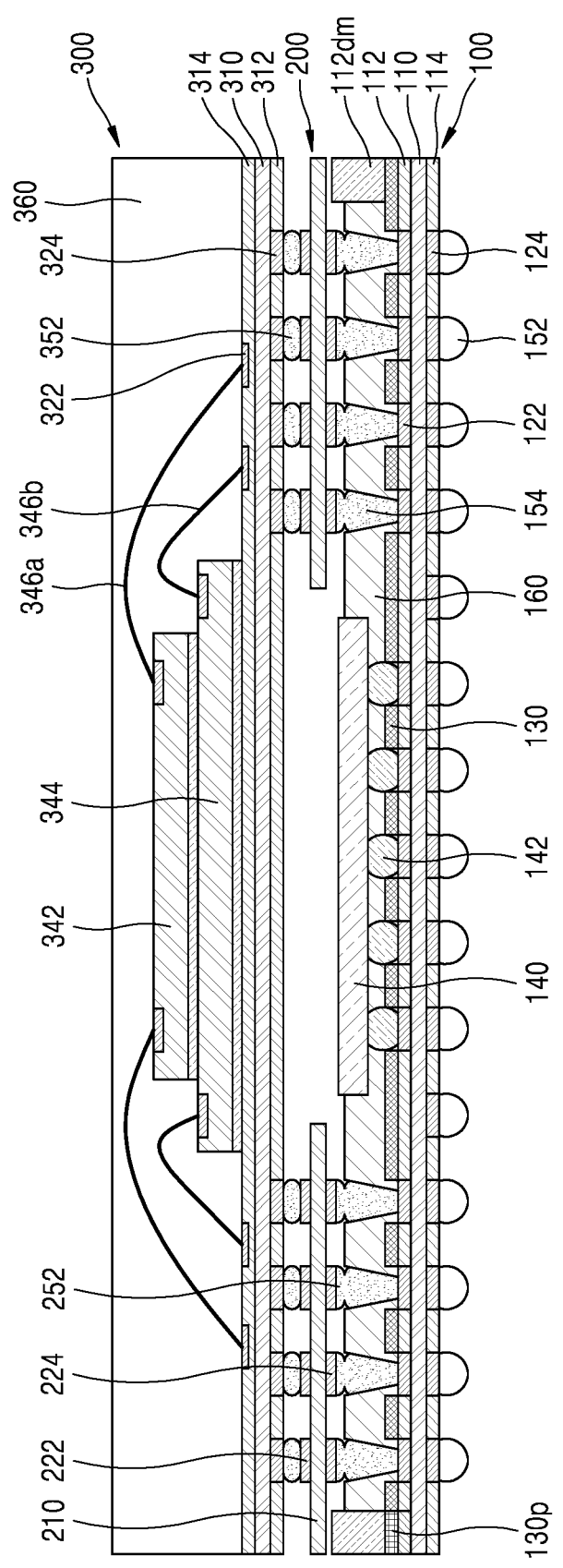

Referring to FIG. 8D, the PoP package may be manufactured through similar operations as described with reference to FIGS. 3I to 3M. The PoP package of FIG. 8D differs in that the surface is modified to form the laser reactive polymer layer 130 with the hydrophilic functional group formed on the surface, on the upper surface solder resist layer 112 in the entire region, and the dam 112dm is formed along the edge of the substrate 111.

FIGS. 9A to 9D are side views illustrating a method of manufacturing a semiconductor package, according to an embodiment. When the manufacturing method of the present embodiment is compared with the embodiment described with reference to FIGS. 3A to 3M, the operations described with reference to FIGS. 3A to 3G are common. Accordingly, an operation of FIG. 9A described below follows the operation shown in FIG. 3G.

Figure 9A:
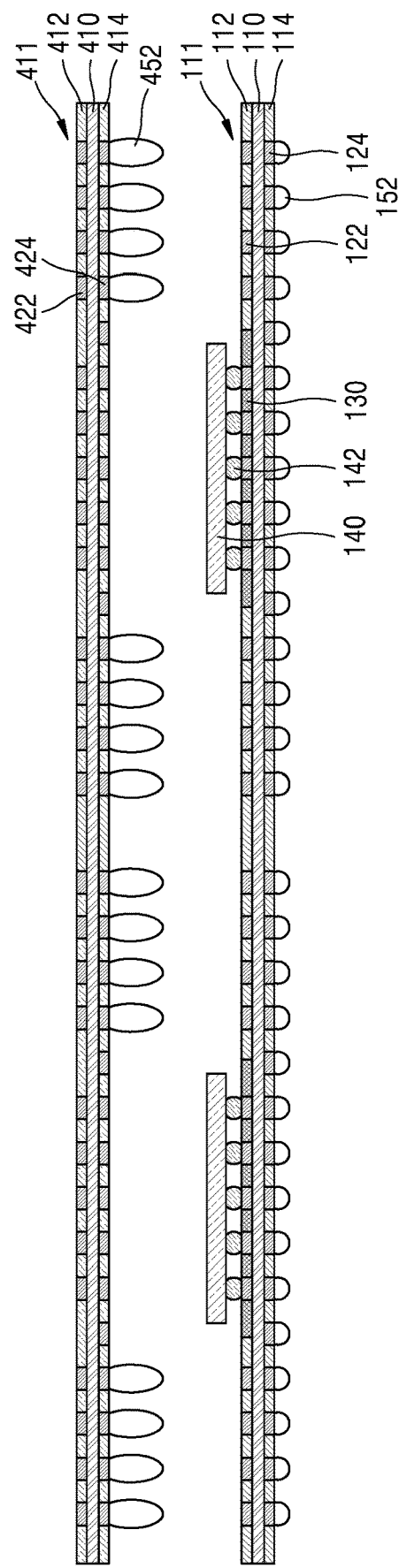
FIGS. 9A to 9D are side views illustrating a method of manufacturing a semiconductor package, according to an embodiment.

Referring to FIG. 9A, an interposer 411 may be provided on the substrate 111 on which the first semiconductor device 140 is mounted.

The interposer 411 may include a base board layer 410 (which may be a silicon base board layer) and an upper pad 422 and a lower pad 424 disposed on the upper and lower surfaces of the base board layer 410, respectively. Configurations of the base board layer 410, the upper pad 422, and the lower pad 424 may be substantially the same as the configurations of the base board layer 110, the upper pad 122, and the lower pad 124 described with reference to FIG. 3A, respectively. Therefore, detailed descriptions thereof are omitted here.

An upper surface solder resist layer 412 and a lower surface solder resist layer 414 exposing the upper pad 422 and the lower pad 424 may be formed on the upper and lower surfaces of the base board layer 410, respectively. Another semiconductor device may be connected to the upper pad 422, and a connection terminal 452 connected to the substrate 111 may be provided on the lower pad 424.

In some embodiments, the base board layer 410 may be formed of a semiconductor material, for example, may be formed from a silicon wafer or other semiconductor wafer. In other words, the base board layer 410 may be a silicon substrate or other semiconductor substrate.

Electrical wiring may be formed on the upper and lower surfaces and/or the inside of the base board layer 410. In some embodiments, a through via electrically connecting the upper pad 422 to the lower pad 424 may be provided inside of the base board layer 410.

Figure 9B:
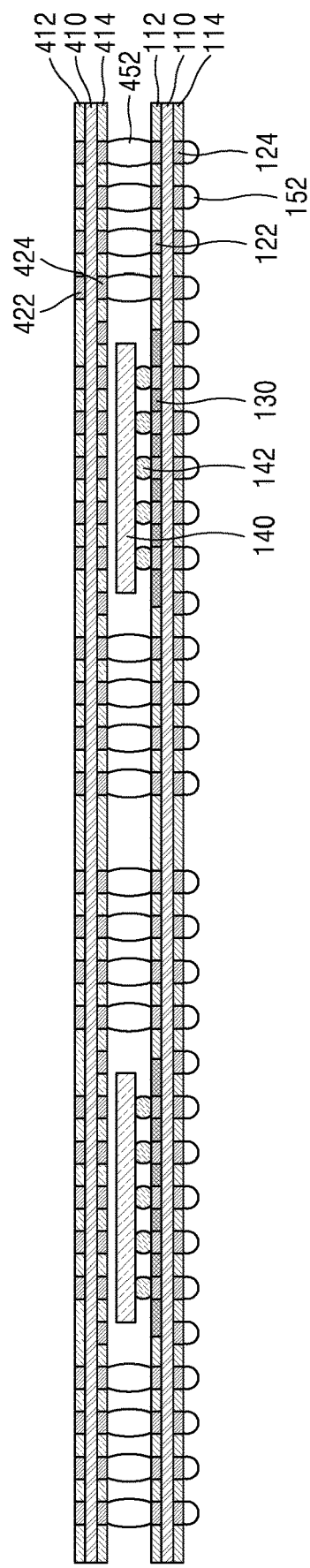

Referring to FIG. 9B, the interposer 411 may be coupled to the substrate 111.

In some embodiments, so as to couple the interposer 411 to the substrate 111, the connection terminal 452 may be reflowed and cured after contacting the upper pad 122 of the substrate 111 corresponding thereto. The connection terminal 452 may be reflowed, for example, at a temperature of about 120° C. to about 250° C.

Figure 9C:
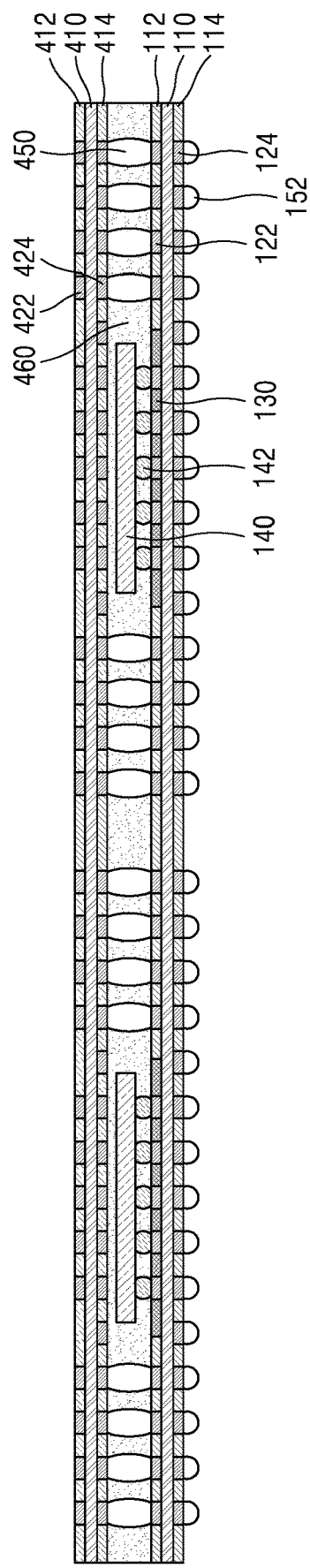

Referring to FIG. 9C, a first encapsulation layer 460 may be formed in a space between the substrate 111 and the interposer 411. The first encapsulation layer 460 may be, for example, a general molding material such as EMC.

The first encapsulation layer 460 may be formed to surround the upper, lower, and side surfaces of the first semiconductor device 140. The first encapsulation layer 460 may be formed, for example, by transfer molding. As described above with reference to FIG. 3G, the first encapsulation layer 460 may be filled more easily by transfer molding because hydrophilic functional groups are uniformly formed on the lower portion of the first semiconductor device 140 at a high concentration due to the modification of the laser reactive polymer layer 130. Accordingly, the space between the first semiconductor device 140 and the substrate 111 may be filled more substantially, and the reliability of the semiconductor package manufactured therefrom may be further increased.

Figure 9D:
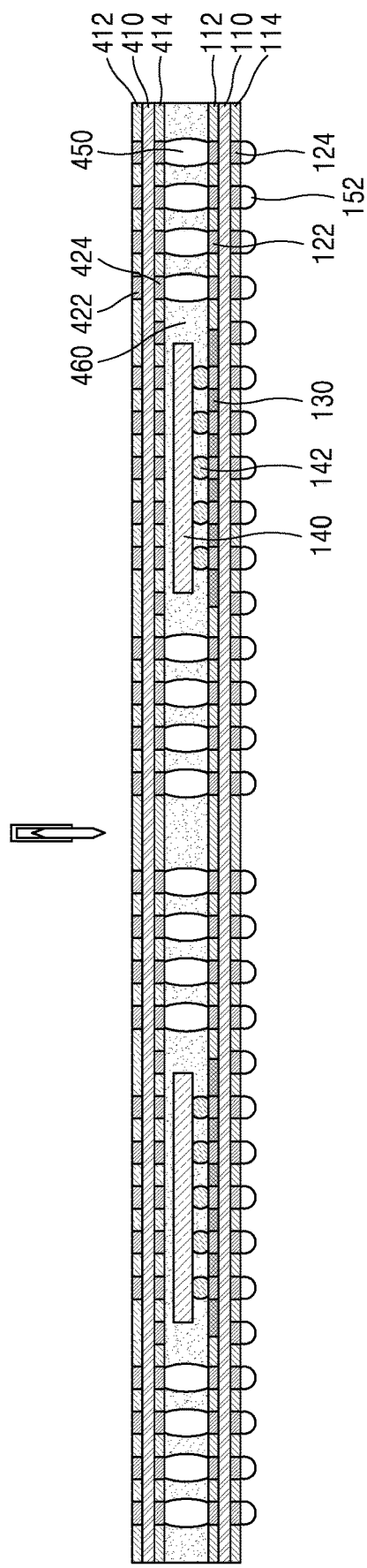

Referring to FIG. 9D, the manufacture of the semiconductor package 400 may be completed by performing singulation. The singulation may be performed by using a method such as mechanical sawing or laser sawing, and is not particularly limited.

Although a molding underfill (MUF) is used in all of the above-described embodiments, a person skilled in the art will understand that a separate underfill may be formed between the first semiconductor device 140 and the substrate 111 prior to forming one or more additional encapsulation layers surrounding the first semiconductor device 140 to encapsulate the first semiconductor device (e.g., first encapsulation material layer 160m may be formed from several different homogenous layers formed of different materials and the first encapsulation material layer 160m need not be homogeneous).

When the manufacturing method of the inventive concept is used, hydrophilic functional groups may be uniformly formed on the lower portion of a semiconductor device mounted on a substrate, and thus an underfill material layer may be more excellently formed. Therefore, a more reliable semiconductor package may be manufactured.

While the inventive concept has been particularly shown and described with reference to embodiments thereof, it will be understood that various changes in form and details may be made therein without departing from the spirit and scope of the following claims.

What is claimed is:

1. A method of manufacturing a semiconductor package, the method comprising:
   forming a laser reactive polymer layer on a substrate;
   mounting a semiconductor device on the substrate;
   irradiating at least a portion of the laser reactive polymer layer below the semiconductor device with a laser having a wavelength capable of penetrating through the semiconductor device on the substrate to modify the laser reactive polymer layer to have a hydrophilic functional group; and
   forming a first encapsulation material layer between the semiconductor device and the substrate.

2. The method of claim 1, wherein the laser reactive polymer layer comprises an ether-based polymer, a phenol-based polymer, a carbonate ester-based polymer, an epoxy-based polymer, a ketone-based polymer, or a combination thereof.

3. The method of claim 2, wherein the wavelength of the laser is from about 190 nm to about 360 nm.

4. The method of claim 3, wherein the laser is an ArF laser, KrF laser, XeCl laser, XeF laser, or a combination thereof.

5. The method of claim 1, wherein the hydrophilic functional group comprises one or more groups of a carboxyl group, an ester group, an epoxy group, a carbonyl group, a phenol group, an aldehyde group, and a peroxide group.

6. The method of claim 1, wherein the substrate comprises a solder resist layer, and
wherein the forming of the laser reactive polymer layer comprises forming a pattern of the laser reactive polymer layer so as not to overlap with the solder resist layer.

7. The method of claim 1, wherein the laser reactive polymer layer comprises a composite of a solder resist material and one or more polymers of an ether-based polymer, a phenol-based polymer, a carbonate ester-based polymer, an epoxy-based polymer, a ketone-based polymer.

8. The method of claim 1, wherein the substrate comprises a solder resist layer, and
wherein the forming of the laser reactive polymer layer comprises forming a pattern of the laser reactive polymer layer on the solder resist layer.

9. The method of claim 1, wherein the substrate comprises a solder resist layer, and
wherein the forming of the laser reactive polymer layer comprises forming the laser reactive polymer layer to cover an entire upper surface of the solder resist layer.

10. The method of claim 1, wherein the substrate comprises a dam extending along an edge, and
wherein the dam is irradiated by the laser.

11. A method of manufacturing a package-on-package (PoP), the method comprising:
manufacturing a first package; and
mounting a second package on the first package, and
wherein the manufacturing of the first package comprises:
forming a laser reactive polymer layer on a first substrate;
mounting a first semiconductor device on the first substrate;
after the mounting of the first semiconductor device, hydrophilizing at least a part of a region of the laser reactive polymer layer overlapping the first semiconductor device; and
forming a first encapsulation material layer between the first semiconductor device and the first substrate.

12. The method of claim 11, wherein the laser reactive polymer layer is formed with respect to a region at least partially overlapping a region where the first semiconductor device is mounted.

13. The method of claim 11, wherein the hydrophilizing comprises irradiating the laser reactive polymer layer with an electromagnetic wave through the first semiconductor device to generate a hydrophilic functional group on the laser reactive polymer layer.

14. The method of claim 13, wherein the hydrophilic functional group comprises one or more groups of a carboxyl group, an ester group, an epoxy group, a carbonyl group, a phenol group, and a peroxide group.

15. The method of claim 14, wherein the electromagnetic wave is a laser having a wavelength of about 190 nm to about 360 nm.

16. The method of claim 11, wherein the first encapsulation material layer is formed to surround at least a lower surface and a side surface of the first semiconductor device.

17. The method of claim 11, wherein the first substrate comprises a plurality of upper pads around a region where the first semiconductor device is mounted,
the method further comprising: between the hydrophilizing and the forming of the first encapsulation material layer, placing an interposer electrically connected to the first substrate on the first semiconductor device,
the mounting of the second package comprises electrically connecting the second package to the interposer.

18. The method of claim 17, wherein the interposer comprises a lower pad electrically connected to the first substrate through a connection terminal and an upper pad electrically connected to the lower pad, and
the interposer comprises a silicon base board layer.

19. The method of claim 11, wherein the mounting of the first semiconductor device comprises mounting a plurality of first semiconductor devices on the first substrate,
the method further comprising: singulating the first package after the forming of the first encapsulation material layer.

20. A method of manufacturing a semiconductor package, the method comprising:
forming a laser reactive polymer layer on a substrate;
providing an interposer on the substrate;
providing a first semiconductor device on the substrate to at least partially overlap the laser reactive polymer layer;
irradiating an upper surface of the first semiconductor device with a laser;
forming a first encapsulation material layer to surround upper, lower, and side surfaces of the first semiconductor device after the irradiating of the upper surface of the first semiconductor device; and
attaching a second semiconductor device on the interposer.

* * * * *